(12) United States Patent
Mishra et al.

(10) Patent No.: US 8,549,257 B2
(45) Date of Patent: Oct. 1, 2013

(54) AREA EFFICIENT ARRANGEMENT OF INTERFACE DEVICES WITHIN AN INTEGRATED CIRCUIT

(75) Inventors: Vikas Mishra, Cupertino, CA (US); Bingda Brandon Wang, Milpitas, CA (US)

(73) Assignee: ARM Limited, Cambridge (GB)

( * ) Notice: Subject to any disclaimer, the term of this patent is extended or adjusted under 35 U.S.C. 154(b) by 359 days.

(21) Appl. No.: 12/929,236

(22) Filed: Jan. 10, 2011

(65) Prior Publication Data

US 2012/0179893 A1  Jul. 12, 2012

(51) Int. Cl.
*G06F 15/00* (2006.01)
*G06F 9/06* (2006.01)

(52) U.S. Cl.
USPC ...................................... 712/11; 712/E9.003

(58) Field of Classification Search
None
See application file for complete search history.

(56) References Cited

U.S. PATENT DOCUMENTS

| 5,933,026 A * | 8/1999 | Larsen et al. ................... 326/81 |
| 6,242,814 B1 | 6/2001 | Bassett |
| 2001/0011768 A1 | 8/2001 | Kohara et al. |
| 2001/0017411 A1 | 8/2001 | Terui |
| 2006/0157740 A1 | 7/2006 | Nonoyama et al. |
| 2008/0128830 A1 | 6/2008 | Kobayashi et al. |
| 2009/0166620 A1 | 7/2009 | Maede |
| 2009/0321904 A1 | 12/2009 | Tanaka |

FOREIGN PATENT DOCUMENTS

WO  WO 2004/093188  10/2004

OTHER PUBLICATIONS

UK Search Report dated May 10, 2012 for GB 1200024.6.

* cited by examiner

*Primary Examiner* — Crystal L Hammond
(74) *Attorney, Agent, or Firm* — Nixon & Vanderhye P.C.

(57) ABSTRACT

An integrated circuit is disclosed that comprises: a core comprising logic circuitry: a plurality of interface devices for transmitting signals to and from the processing core, the plurality of interface devices comprising two types of interface devices: one type being a power interface device for delivering power to the core; and a second type being a signal interface device for transmitting data signals between the core and devices external to the integrated circuit; wherein the plurality of interface devices are arranged in two rows, an outer row towards an outer edge of the core and an inner row within the outer row closer to a centre of the core the inner row comprising one of the two types of interface devices and the outer row comprising an other of the two types of interface devices.

16 Claims, 5 Drawing Sheets

AREA EFFICIENT ARRANGEMENT OF INTERFACE DEVICES WITHIN AN INTEGRATED CIRCUIT

BACKGROUND OF THE INVENTION

1. Field of the Invention

The field of the invention relates to semiconductor chips and in particular to providing input/output interface devices for these semiconductor chips.

2. Description of the Prior Art

In typical semiconductor fabrication techniques, data handling cores or chips are fabricated with data handling logic circuitry such as processing logic or data storage within them. These chips are built up in large numbers on a single wafer of semiconductor material, typically silicon. In order to provide power and data access to the chips, the individual chips are patterned with small connection or bonding pads. These are pads of conductive material such as metal and are generally arranged near the edge of the chips to make external access to these pads easier.

The chips are cut out of the wafer and mounted in packaging and wires are typically bonded to the bonding pads to allow signals and power to be transmitted to and from the chips. These bonding pads connect to the chip via input/output devices that provide some handling and control of the power and signals that are received and transmitted. The wires lead to pins on the outside of the packaging, which are attached to the rest of the circuitry making up the electronic system.

As chips become more complex, more and more input/output devices are required to handle the power and data signals transmitted to and from the chip.

In order to provide a compact easily built system these input/output devices are generally designed to abut each other and to have the same length. In this way they are aligned with each other so that power rails can be built across a row of input/output devices and each input/output device can be connected to any one of the rails as required. The length of an input/output device is the dimension of the device that is perpendicular to an external edge of the chip that the device is sitting adjacent to. It is also advantageous if these input/output devices all have the same width as this makes it easier when arranging the wires between the bonding pads and the external pins on the packaging, as these pins are generally arranged in a set pattern.

The input/output devices are therefore designed to be the same size and this is the size of the largest input/output device required. As the size of a chip is limited the increasing number of input/output devices required in increasingly complex systems along with these devices all being the same size and being arranged close to an edge of the chip leads to a problem of restricted space available for mounting of the input/output devices.

In some techniques the input/output devices have been designed to be narrower and correspondingly longer so that more input/output devices can be fitted alongside each other on the outer edge of the chip. However, a drawback of this is that the bonding area required to bond a wire to the input/output device is then wider than the input/output device itself, so that these bonding pads cannot be aligned with each other. This arrangement is termed a staggered arrangement and this leads to a difference in length of the bonding wires which can introduce skew into the system.

It would be desirable to provide a system with an increased number of input/output devices while not unduly increasing skew into the system.

SUMMARY OF THE INVENTION

A first aspect of the present invention provides an integrated circuit comprising: a core comprising logic circuitry: a plurality of interface devices for transmitting signals to and from said processing core, said plurality of interface devices comprising two types of interface devices: one type being a power interface device for delivering power to said core; and a second type being a signal interface device for transmitting data signals between said core and devices external to said integrated circuit; wherein said plurality of interface devices are arranged in two rows, an outer row towards an outer edge of said core and an inner row within said outer row closer to a centre of said core, said inner row comprising one of said two types of interface devices and said outer row comprising another of said two types of interface devices.

A dual row technique that has two rows of interface devices would seem to overcome the problem of the limited space on the outer edge of the chip. However the provision of two rows means that wires connecting interface devices on the inner row with external pins are longer than wires connecting devices in the outer row and this can lead to skew between data signals sent along different wires. It is particularly important for some data signals such as those on a byte link that the signals are well matched and thus, skew between such signals should be avoided or at least reduced wherever possible.

The present invention addresses this by providing all of the signal interface devices in one row and the power interface devices in another. Having the signal interface devices in the same row means that the wires connecting these devices to the external pins will be of similar lengths and thus, the problems arising due to wires of different lengths being used for data signals being sent from signal interface devices in different rows will not arise. Skew is generally a problem that arises between different data signals from different signal interface devices, and not between signals from power interface devices and signal from signal interface devices.

Furthermore, where interface devices of a same type are arranged in a same row, the sizing of the devices which allows them to be aligned can be done just for devices of a same type. Thus, signal interface devices can be configured to be the same size and power interface devices can also be configured to be the same size, the two types do not however need to be the same size as each other. This will in general reduce the size requirements for one of the device types.

Thus, the dual rows arranged in this way will provide additional area for mounting the interface devices without increasing the skew due to data signals being sent along different length wires and there will also be area savings due to the reduced size of one type of device.

Although the inner and outer rows may contain either type of interface device provided each row contains only one type, in some embodiments the inner row comprises signal interface devices and the outer row comprises power interface devices.

Placing power interface devices on an outside of the core provides some electrical shielding to the core and results in a system with improved electrical static discharge or ESD properties and improved latch performance.

In some embodiments said outer row comprises a row around an outer periphery of said core and said inner row comprises a row in parallel with and inside said outer row.

As noted previously it is advantageous if the interface devices are placed around an outer edge of the core as this reduces the required wire length. Furthermore, it is convenient for the arrangement of the rails if these rows of interface devices are parallel with each other.

In some embodiments said interface devices are rectangular and have a length, said length being a dimension of said connection pad that lies perpendicular to said row said connection pad lies on, and a width said width being a dimension that lies parallel to said row said connection pad lies on, each of said plurality of power interface devices having substantially a same length and each of said plurality of signal interface devices having substantially a same length, said length of said power interface devices being different to a length of said signal interface devices.

The present invention recognises that in general, power interface devices do not have the same size requirements as signal interface devices, and thus, if two rows of interface devices are used each row only having one type of interface device on it, then each type of interface device could be sized just for that type. This would generally result in the ability to reduce the size of the power interface devices and a system with power interface devices that are smaller than the signal interface devices would be produced.

In some embodiments said power interface devices have a length that is shorter than a length of said signal interface devices.

Generally it is advantageous if said power interface devices and said signal interface devices all have substantially a same width as this allows the pads to be more conveniently connected to external pins. Thus, the reduction in size of one pad compared to another is generally done by reducing their length.

In some embodiments at least some of said power interface devices in said outer row abut each other and at least some of said signal interface devices in said inner row abut each other.

The interface devices are generally arranged to abut each other. Where they area arranged around an edge of a chip it may be that at a corner they do not abut each other but perhaps abut a corner device.

In some embodiments dimensions such as length and width that are substantially the same as each other comprise dimensions that differ from each other by less than 1 micrometer.

Clearly manufacturing tolerances are such that devices that are designed to be the same size as each other may in fact have slightly different sizes. Generally a tolerance of about 1 micron is acceptable for such a design, such that devices with a difference in size of less than one micron are considered to be the same size.

In some embodiments said power interface devices and said signal interface devices are aligned with each other in their respective outer and inner rows.

External pins are generally arranged in a set pattern evenly distributed around an outside edge of the core, thus, it is advantageous if the pads are also arranged in an even manner. This also helps in reducing skew and improving the shielding aspects of the power interface devices.

In other embodiments said power interface devices and said signal interface devices are offset with respect to each other by a distance of half said width in their respective outer and inner rows.

Another even pattern that may have further advantages is one where the interface devices in each row are offset by half an interface device with respect to each other. Such an arrangement is particularly advantageous as wires sent to the different devices in the different rows may be sent adjacent to each other within a same plane the offset providing enough space for the wires from different rows to run parallel to each other. Where the devices are aligned the wires may need to be isolated from each other by being sent in different planes.

In some embodiments said interface devices comprise bonding pads for bonding wires to said interface devices, said bonding pads having a width that is narrower than a width of said interface devices.

It is advantageous if the bonding pads are narrower than the interface devices as in this case they can be aligned with each other along a row parallel to an edge of said core. This means that the wires from these bonding pads to external pins will have substantially the same length thereby reducing skew. If the bonding pads are wider than the interface devices then they will need to be arranged in a staggered fashion and not be aligned. This results in different length wires but has an advantage of allowing narrower interface devices.

A second aspect of the present invention provides a method of providing signals to an integrated circuit comprising a core comprising logic circuitry, said method comprising: arranging a plurality of interface devices for transmitting signals to and from said processing core around an edge of said processing core; wherein said plurality of interface devices comprising two types of interface devices, one type being a power interface device for delivering power to said core and a second type being a signal interface device for transmitting data signals between said core and devices external to said integrated circuit; said method comprising arranging said plurality of interface devices in two rows, an outer row lying towards an outer edge of said core and an inner row lying within said outer row closer to a centre of said core, said inner row comprising one of said two types of interface devices and said outer row each comprising an other of said two types of interface devices.

A third aspect of the present invention an integrated circuit comprising: a core comprising logic circuitry: a plurality of interface means for transmitting signals to and from said processing core, said plurality of interface means comprising two types of interface means: one type being a power interface means for delivering power to said core; and a second type being a signal interface means for transmitting data signals between said core and devices external to said integrated circuit; wherein said plurality of interface means are arranged in two rows, an outer row towards an outer edge of said core and an inner row within said outer row closer to a centre of said core said inner row comprising one of said two types of interface means and said outer row comprising an other of said two types of interface means.

The above, and other objects, features and advantages of this invention will be apparent from the following detailed description of illustrative embodiments which is to be read in connection with the accompanying drawings.

DESCRIPTION OF EMBODIMENTS

Figure 1:
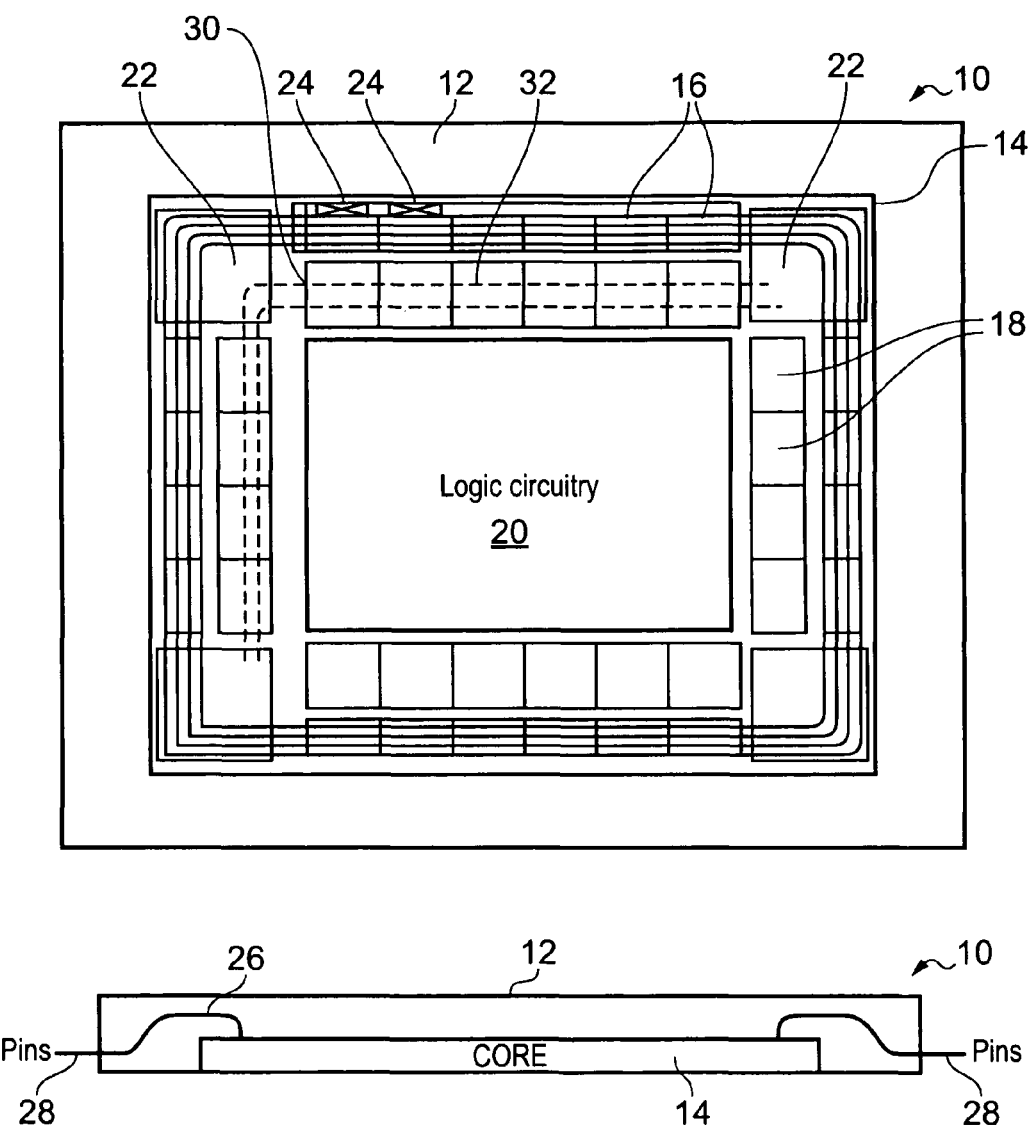
FIG. 1 shows an integrated circuit according to an embodiment of the present invention.

FIG. 1 shows an integrated circuit 10 according to an embodiment of the present invention. This integrated circuit is shown in plan view and in side elevation.

Integrated circuit 10 comprises packaging 12 which is formed around and over the core 14. Core 14 is formed of a semiconductor material and comprises an outer portion having interface or input/output devices. These input/output devices are formed in two rows, an outer row in this embodiment comprising power input/output devices 16 and an inner row comprising signal input/output devices 18. The power input/output devices 16 provide the voltage levels required for the different voltage domains. The data processing system may operate in two voltage domains a higher voltage domain between DVDD and DVSS which may a domain that peripheral devices such as USB drivers operate at and a lower voltage domain between VDD and VSS that logic circuitry within the silicon may operate at. The power input/output devices provide appropriate voltage levels for these different power domains.

As noted previously logic circuitry 20 operates with an operating voltage between VDD and VSS while external devices with which it communicates may operate at a higher operating voltage domain. Thus, the power cells 16 provide a power supply at both the higher operating voltage domain and at the lower operating voltage domain and signal interface or input/output devices 18 receive the different power signals and convert signals that are going to the logic circuitry 20 to the lower voltage domain and convert signals received from the logic circuitry that are destined for circuitry external to the integrated circuit 10 to the higher voltage domain.

Thus, there are a number of power rails that run around the edge of the core 14 and these carry the voltage levels for both voltage domains. They not only provide sources of power for the various input/output cells but they also provide some electrical shielding of the logic circuitry 20.

In the corners of the core 14 are corner cells 22 which act to route the power rails around the corners. These cells have little logic themselves.

Each of the interface or input/output devices 16 and 18 has a bonding pad 24. These are only shown on two of the input/output cells for ease of illustration. These bonding pads allow a wire 26 to be connected between the input/output device and an external pin. This allows signals and power to be transmitted to and from the logic circuitry 20.

The size of the bonding pads 24 to bond the wires are a determining factor in the size of the input/output cells and in this embodiment the bonding pads are approximately the same width as the input/output cells. If they were wider than these cells then they could not be aligned and staggering in their location would result in different length wire links which would result in skew in the signals transmitted.

As can be seen in this embodiment the signal input/output devices 18 are larger than the power input/output devices as they require more logic. However, as the power input/output devices and the signal input/output devices are arranged on different rows then the power input/output devices can have a smaller width compared to the signal input/output devices while maintaining their alignment. This alignment is important as it allows the rails that run along the devices to be connected to each of the input/output devices.

Although not shown clearly in this diagram, there are power rails for the higher voltage domain and power rails for the lower voltage domain that run in a ring around the power input/output devices and also are connected to other rails that run over the signal input/output devices. A portion of two rails that run over the signal input/output devices are shown as 30 and 32 in FIG. 1. These provide connections from the power rails to the signal input/output devices. Although only a portion of these rails is shown for simplicity in reality these rails would run around the whole circumference in the same way that the rails run around the power input/output devices.

The cross-section of the integrated circuit 10 shown in FIG. 1 shows that the core 14 lies within and underneath packaging 12. External pins 28 from the packaging are connected via wires 26 to the core. The core is bonded to the wires via the bonding pads 24 which are shown on the power input/output devices 16, but which are also present on the signal input/output devices.

The signal input/output devices receive signals from the logic circuitry and convert them to the higher voltage domain before outputting them. Alternatively, they may receive external signals in the higher voltage domain and convert them to the lower voltage domain before transmitting them to the logic circuitry. In this way devices operating with signals in different voltage domains can communicate with each other.

Figure 2:
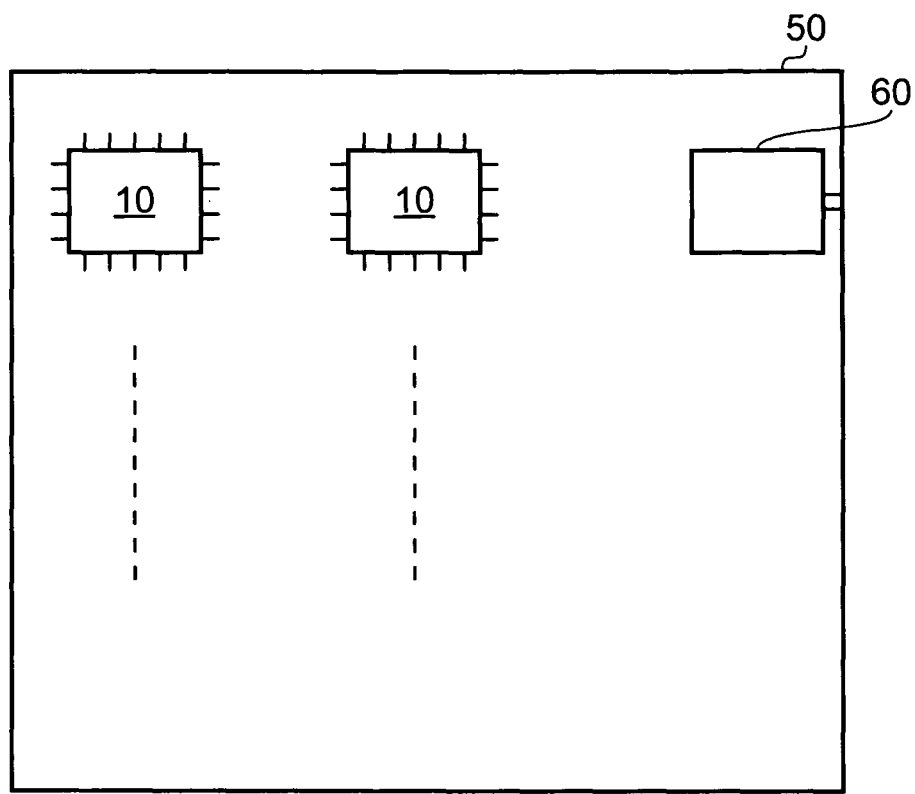
FIG. 2 schematically shows a processing apparatus comprising a plurality of integrated circuits according to an embodiment of the present invention.

This is shown in more detail in FIG. 2. FIG. 2 shows a processing apparatus 50 comprising several integrated circuits 10 and a further peripheral device 60. The peripheral device 60 is in this embodiment a USB driver and this operates in the higher voltage domain. These devices are all mounted on a board not shown and the external pins from these devices connect to connections within the board and allow signals between the devices to be transmitted. Owing to the power input/output devices and the signal input/output devices arranged in the integrated circuit 10 these devices operating in different voltage domains can communicate with each other.

Figure 3:
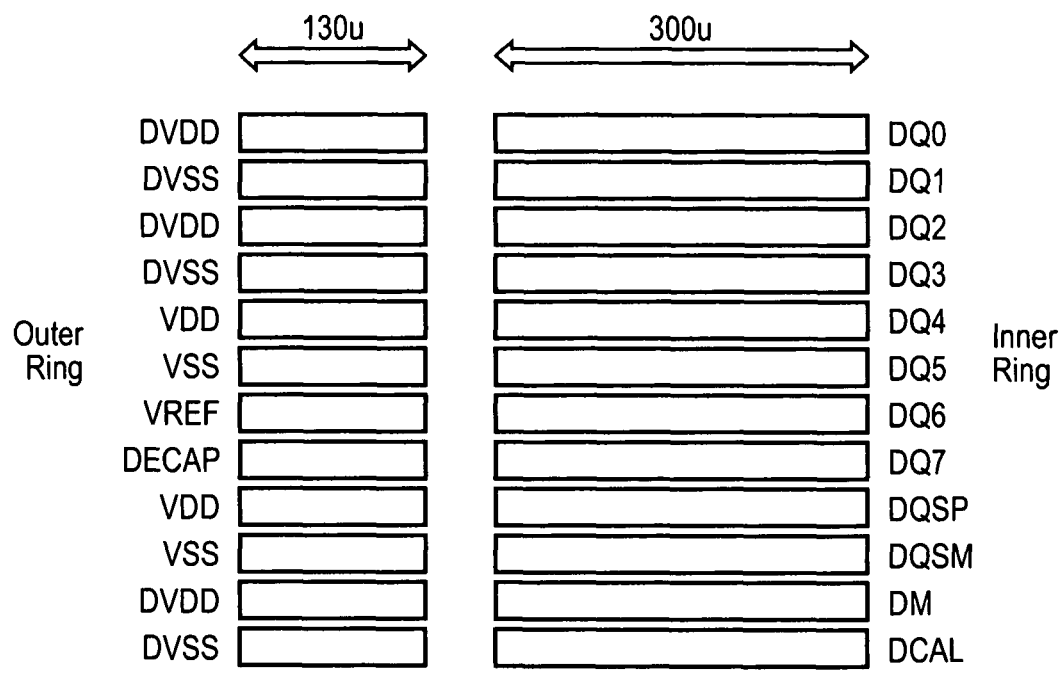
FIG. 3 schematically shows arrangements of interface devices in inner and outer rings according to an embodiment of the present invention.

FIG. 3 shows very schematically a portion of the outer and inner ring of the input/output devices according to an embodiment of the present invention. DQ0-DQ7 represent data cells of a byte lane while DQSP/DQSM represent strobe signals. The outer ring comprises the power cells, the VDD and VSS cells being power cells of the higher voltage domain while the VDD and the VSS cells are cells of the lower voltage domain. There is also a voltage reference cell and a DECAP cell which is a decoupling capacitance cell. These cells in the outer ring are shorter at 130μ than the 300μ signal input/output cells which are shown as lining the inner ring. These cells receive and process different signals, ensuring that signals received in one voltage domain are output in another voltage domain as appropriate.

Figure 4:
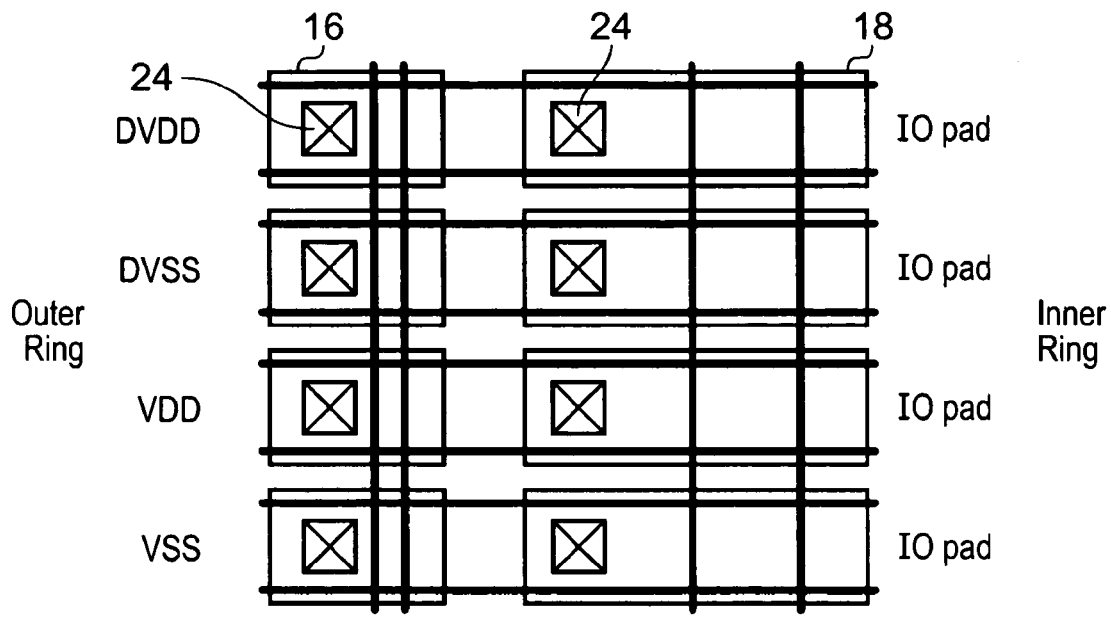
FIG. 4 shows interface devices aligned to each other according to an embodiment of the present invention.

FIG. 4 shows schematically power cells and signal input/output cells arranged in a portion of an input/output loop. In this diagram the power cells 16 are each shown as having wire bonding regions 24 as are the input/output cells. Additionally the rails that transmit the signals between the cells are shown. It should be noted that the wire bonding is a process that requires a relatively large bonding pad which is shown as 24. The connection between the cells and the rails can be made much more easily. Thus, as the rails run over each of the cells, each of the cells can connect to whichever of the rails they require signals from.

In this embodiment, the cells are not shown as abutting each other for simplicity of illustration, however in reality the cells in the individual rows will abut each other. In this embodiment, the power cells and signal cells align with each other and thus, the wires that are bonded to the bonding pads will come in at the same place and thus, need to come in different planes.

Figure 5:
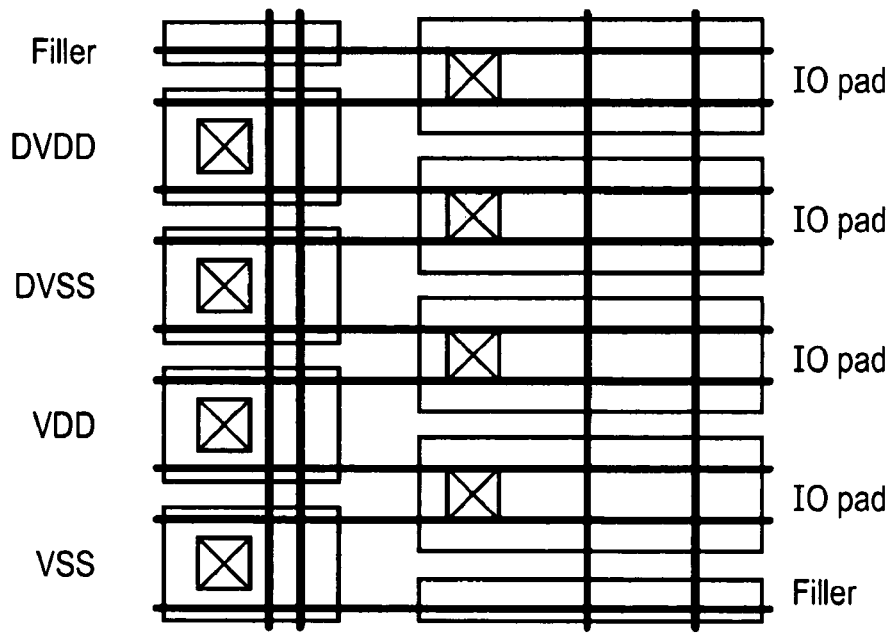
FIG. 5 shows interface devices arranged off set to each other by half full interface widths according to an embodiment of the present invention.

FIG. 5 shows an alternative embodiment where the cells are staggered with respect to each other. Once again, the cells are not shown as abutting whereas in reality they would be. As can be seen in this arrangement, the wires can travel to the cells alongside each other and thus, there is no need to send them in different planes and thus, this arrangement can provide the wire connections more efficiently than the previous arrangement.

In both arrangements the layout of the cells occurs in a regular pattern and this aligns with the regular pattern of the pins on the external packaging of the integrated circuit.

As can be seen, this dual row arrangement allows the signal interface devices to have a longer length than the power interface devices and yet still be aligned to each other such that rails that travel over one travel over all the others. Furthermore, the bonding pads are aligned with each other such that the wires carrying the data signals are of a similar length and thus, skew between these signals that would arise were they sent along wires of different lengths is reduced.

Figure 6:
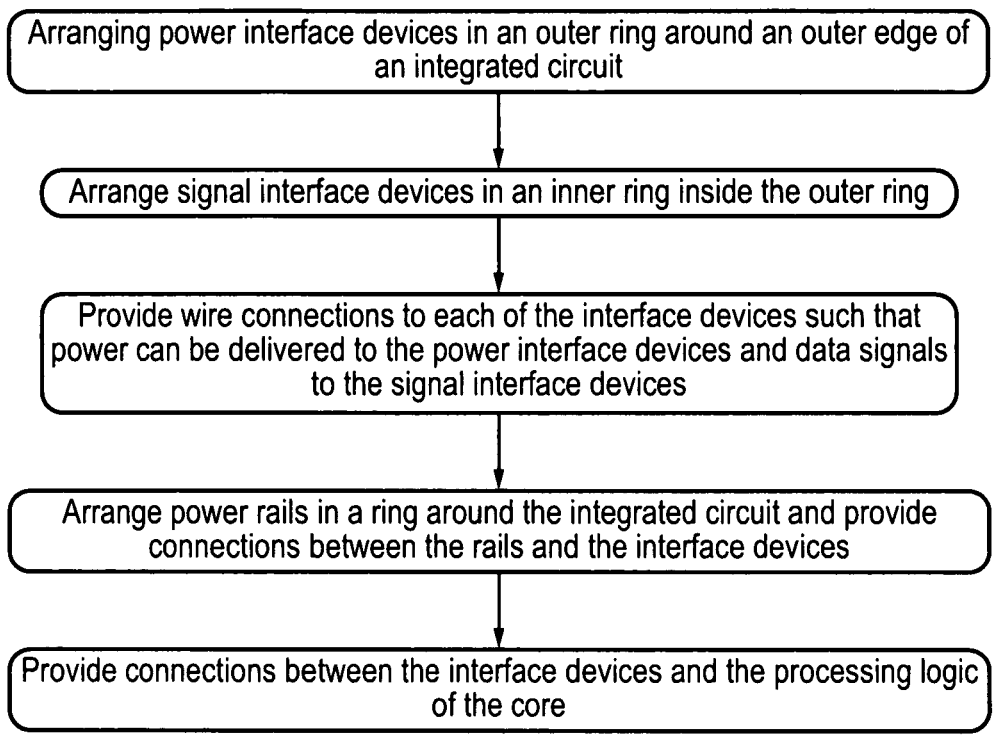
FIG. 6 shows a flow diagram illustrating steps in the method according to an embodiment of the present invention.

FIG. 6 shows a flow diagram illustrating steps in a method according to an embodiment of the present invention. This method provides a method of supplying power and signals to an integrated circuit. A step of arranging power interface devices in an outer ring around an edge of an integrated circuit is performed along with a step of arranging signal interface devices in an inner ring inside the outer ring. It should be noted that these steps can be performed in any order or even at the same time. Wire connections are provided to each of the interface devices such that power signals can be delivered to the power interface devices and data signals to the signal interface devices.

Power rails are then arranged in a ring around the integrated circuit and connections are provided between these rails and the interface devices. Connections are also provided between the interface devices and the processing logic of the core. In this way, the interface devices allow signals to be sent to and from the core and allow these signals to be level shifted from one voltage domain to another voltage domain, such that devices and circuits operating in different voltage domains within a system can communicate with each other.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. An integrated circuit comprising:
a core comprising logic circuitry:
a plurality of interface devices for transmitting signals to and from said processing core, said plurality of interface devices comprising two types of interface devices:
one type being a power interface device for delivering power to said core; and
a second type being a signal interface device for transmitting data signals between said core and devices external to said integrated circuit; wherein
said plurality of interface devices are arranged in two rows, an outer row towards an outer edge of said core and an inner row within said outer row closer to a centre of said core said inner row comprising one of said two types of interface devices and said outer row comprising an other of said two types of interface devices.

2. An integrated circuit according to claim 1, wherein said inner row comprises signal interface devices and said outer row comprises power interface devices.

3. An integrated circuit according to claim 1, wherein said outer row comprises a row around an outer periphery of said core and said inner row comprises a row in parallel with and inside of said outer row.

4. An integrated circuit according to claim 1, wherein said interface devices are rectangular and have a length, said length being a dimension of said interface device that lies perpendicular to said row said interface device lies on, and a width said width being a dimension that lies parallel to said row said interface device lies on, each of said plurality of power interface devices having substantially a same length and each of said plurality of signal interface devices having substantially a same length, said length of said power interface devices being different to a length of said signal interface devices.

5. An integrated circuit according to claim 4, wherein said power interface devices have a length that is shorter than a length of said signal interface devices.

6. An integrated circuit according to claim 4, wherein said power interface devices and said signal interface devices all have substantially a same width.

7. An integrated circuit according to claim 4, wherein dimensions that are substantially the same as each other comprise dimensions that differ from each other by less than 1 micron.

8. An integrated circuit according to claim 4, wherein said power interface devices and said signal interface devices are aligned with each other in their respective outer and inner rows.

9. An integrated circuit according to claim 4, wherein said power interface devices and said signal interface devices are offset with respect to each other by a distance of half said width in their respective outer and inner rows.

10. An integrated circuit according to claim 4, wherein said interface devices comprise bonding pads for bonding wires to said interface devices, said bonding pads having a width that is narrower than a width of said interface devices.

11. An integrated circuit according to claim 10, wherein said bonding pads of each of said rows of interface devices are aligned with each other along a row parallel to an edge of said core.

12. An integrated circuit according to claim 1, wherein at least some of said power interface devices in said outer row abut each other and at least some of said signal interface devices in said inner row abut each other.

13. A method of providing signals to an integrated circuit comprising a core comprising logic circuitry, said method comprising:
arranging a plurality of interface devices for transmitting signals to and from said processing core around an edge of said processing core; wherein
said plurality of interface devices comprising two types of interface devices, one type being a power interface device for delivering power to said core and a second type being a signal interface device for transmitting data signals between said core and devices external to said integrated circuit; said method comprising
arranging said plurality of interface devices in two rows, an outer row lying towards an outer edge of said core and an inner row lying within said outer row closer to a centre of said core, said inner row comprising one of said two types of interface devices and said outer row each comprising an other of said two types of interface devices.

14. A method according to claim 13, wherein said step of arranging said plurality of devices in two rows comprises arranging signal interface devices in said inner row and power interface devices in said outer row.

15. A method according to claim 13, wherein said signal interface devices and said power interface devices have a same width and said step of arranging said plurality of devices in two rows comprises arranging said power interface devices and said signal interface devices to be offset with respect to each other by a distance of half said width in their respective outer and inner rows.

16. An integrated circuit comprising:
   a core comprising logic circuitry:
   a plurality of interface means for transmitting signals to and from said processing core, said plurality of interface means comprising two types of interface means:
   one type being a power interface means for delivering power to said core; and
   a second type being a signal interface means for transmitting data signals between said core and devices external to said integrated circuit; wherein
   said plurality of interface means are arranged in two rows, an outer row towards an outer edge of said core and an inner row within said outer row closer to a centre of said core said inner row comprising one of said two types of interface means and said outer row comprising an other of said two types of interface means.

* * * * *